United States Patent
Batson et al.

(10) Patent No.: US 6,791,855 B2
(45) Date of Patent: Sep. 14, 2004

(54) REDUNDANT ARRAY ARCHITECTURE FOR WORD REPLACEMENT IN CAM

(75) Inventors: Kevin A. Batson, Williston, VT (US); Robert E. Busch, Essex Junction, VT (US); Gary S. Koch, Jeffersonville, CT (US); Fred J. Towler, Essex Junction, VT (US); Reid A. Wistort, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/641,753

(22) Filed: Aug. 14, 2003

(65) Prior Publication Data

US 2004/0052134 A1 Mar. 18, 2004

Related U.S. Application Data

(62) Division of application No. 10/123,493, filed on Apr. 15, 2002, now Pat. No. 6,728,123.

(51) Int. Cl.$^7$ ............................ G11C 15/00; G11C 7/00
(52) U.S. Cl. ........................................ 365/49; 365/200
(58) Field of Search .................... 365/49, 200, 230.06, 365/52

(56) References Cited

U.S. PATENT DOCUMENTS

| 6,137,707 | A | * | 10/2000 | Srinivasan et al. | ............ 365/49 |
| 6,275,406 | B1 | * | 8/2001 | Gibson et al. | ................ 365/49 |
| 6,697,912 | B2 | * | 2/2004 | Akkary | ....................... 711/108 |

* cited by examiner

*Primary Examiner*—Anh Phung
(74) *Attorney, Agent, or Firm*—Steven Capella

(57) ABSTRACT

The present invention provides a memory architecture that allows memory checking and replacement of defective words by spare elements already provided on the chip that do not increase the chip size. The method of the invention uses a separate redundant array architecture to provide address translation, so that the redundant entries are represented as the correct entry index that they are replacing.

6 Claims, 4 Drawing Sheets

REDUNDANT ARRAY ARCHITECTURE FOR WORD REPLACEMENT IN CAM

This application is a divisional of U.S. patent application Ser. No. 10/123,493 filed Apr. 15, 2002, now U.S. Pat. No. 6,728,123 issued on Apr. 27, 2004, the disclosure of which is incorporated herein by reference.

BACKGROUND OF THE INVENTION

1. Field of the Invention

The present invention relates to semiconductor computer memories, and more particularly to a redundancy architecture and technique that provides a separate array for word replacement without impacting the size or performance of content-addressable memories (CAM).

2. Background Description

The ability of a memory system to continue correct performance of its tasks after the occurrence of hardware or software faults is highly important. The physical replication of hardware is perhaps the most common technique of providing of fault tolerance used in the memory systems. As semiconductor components of memories have become more densely integrated and increased of capacity, the concept of hardware redundancy has become more common and more practical.

According to the trend of high density of semiconductor devices, redundancy techniques are employed to substitute defect-free memory cells for defective redundant memory cells in order to improve the manufacturing yield of products. At the same time, high-density semiconductor memory devices require division of memory cells into a plurality of blocks containing predetermined memory cells in order to achieve high-speed operation and low power consumption. Since semiconductor memories comprise a matrix of memory cells arranged in rows (word lines) and columns (bit lines), redundant word lines and/or redundant bit lines are provided to functionally replace defective word lines and/or defective bit lines, respectively. Generally, since memory cells in a memory device have relatively more defects in columns, the semiconductor memory devices arrange spare or redundant columns in which redundant memory cells are associated with each block and have used a column redundancy scheme which replaces a normal column containing a defective normal memory cell or cells with a redundant column having defect-free redundant memory cells in the same block. In some high-performance SRAM, a separate redundant array has been used for word line replacement.

Associative memories or content-addressable memories retrieve information on the basis of data content stored rather than addresses. An associative memory performs comparison (i.e., exclusive-OR or equivalent) operations at its bit level. The result of comparison on a group of bits in words in the memory are transmitted to a register called a response register or flag. In general, CAM can be viewed as comprising a number of bit-serial processing elements. Furthermore, the bit-level logic is moved out of the memory part of the processor so that the memory part of the processor comprises a number of random-access memories called word modules. This type of organization of CAM provides a simplicity in design and low cost of an associative processor, but the bit-serial operations slow down the system drastically while the growth in the communication industry is driving the need for larger CAM circuits. Therefore, the area of the CAM increases as well as the probability of a possible defect occurring. Therefore providing redundancy of CAM circuitry is a very important issue. However, the known approaches to provide redundancy in CAM present substantial problems.

Known CAM redundancy techniques generally have used additional redundancy circuitry which takes space on the memory chip. Techniques which have minimized additional circuitry (e.g., use of priority encodes to implement word-line redundancy) typically limit test capability and/or increase the test time. Thus, there is a need for improved architectures and techniques for implementing redundancy in CAM.

SUMMARY OF THE INVENTION

In view of foregoing, a new redundancy architecture in a CAM has been invented. This type of redundancy does not increase chip size and allows CAM testing and replacement of defective words by spare elements already provided on the chip. The invention provides improved fault tolerance for semiconductor CAM.

In one aspect, the invention encompasses a content-addressable memory system with a separate array for word redundancy comprising:

a default CAM memory array for storing data;

a redundancy latch;

a redundant CAM memory array containing redundant word-lines;

a redundancy register array for storing at least one respective address of a defective word and for performing the index translation between the redundant array and default memory arrays;

a compare logic, coupled to the redundancy memory array.

In another aspect, the invention encompasses a method of redundancy of word-lines in a content-addressable memory, comprising the step of parallel search of both default and redundant arrays and capturing hit/miss data for each of the word lines in the default CAM array and the redundant CAM arrays.

These and other aspects of the invention are described in further detail below.

DETAILED DESCRIPTION OF THE INVENTION

The present invention provides a memory architecture that allows memory checking and replacement of defective words by spare elements already provided on the chip that do not increase the chip size. The method of the invention uses a separate redundant array architecture to provide address translation, so that the redundant entries are represented as the correct entry index that they are replacing.

In the present method, the word line redundancy architecture allows for a parallel search of both the default memory array and redundant memory array. During a search operation, if the hit signal in the redundant array is active (i.e. a match occurred), the index from the redundant array is translated from n−m bits to n bits, where m is the width of an address word. If a hit also occurred in the default array, the comparator provides the lowest index of occurrence. During a read/write operation a n-bit address is translated to a m bit index by the redundancy register array. The redundancy register array first checks whether the n-bit address is in the redundant array and then converts that address to a m bit index and selects it for read/write. If the m index is not in the redundant array, the read/write operation is only performed in the default array.

The present invention avoids look-up operation complications in content-addressable memories. Therefore, the solution is to pair the redundant array with a logic block or redundant register array, which functions as a sort of a CAM within CAM. The redundant register array acts as content-addressable memory using the requested address as a checking key during read and write operations. The result of this search tells whether the requested address is stored in the separate redundant array and, if so, in which redundant entry. If found, the read/write operation to the redundant array is allowed to proceed.

Figure 1:
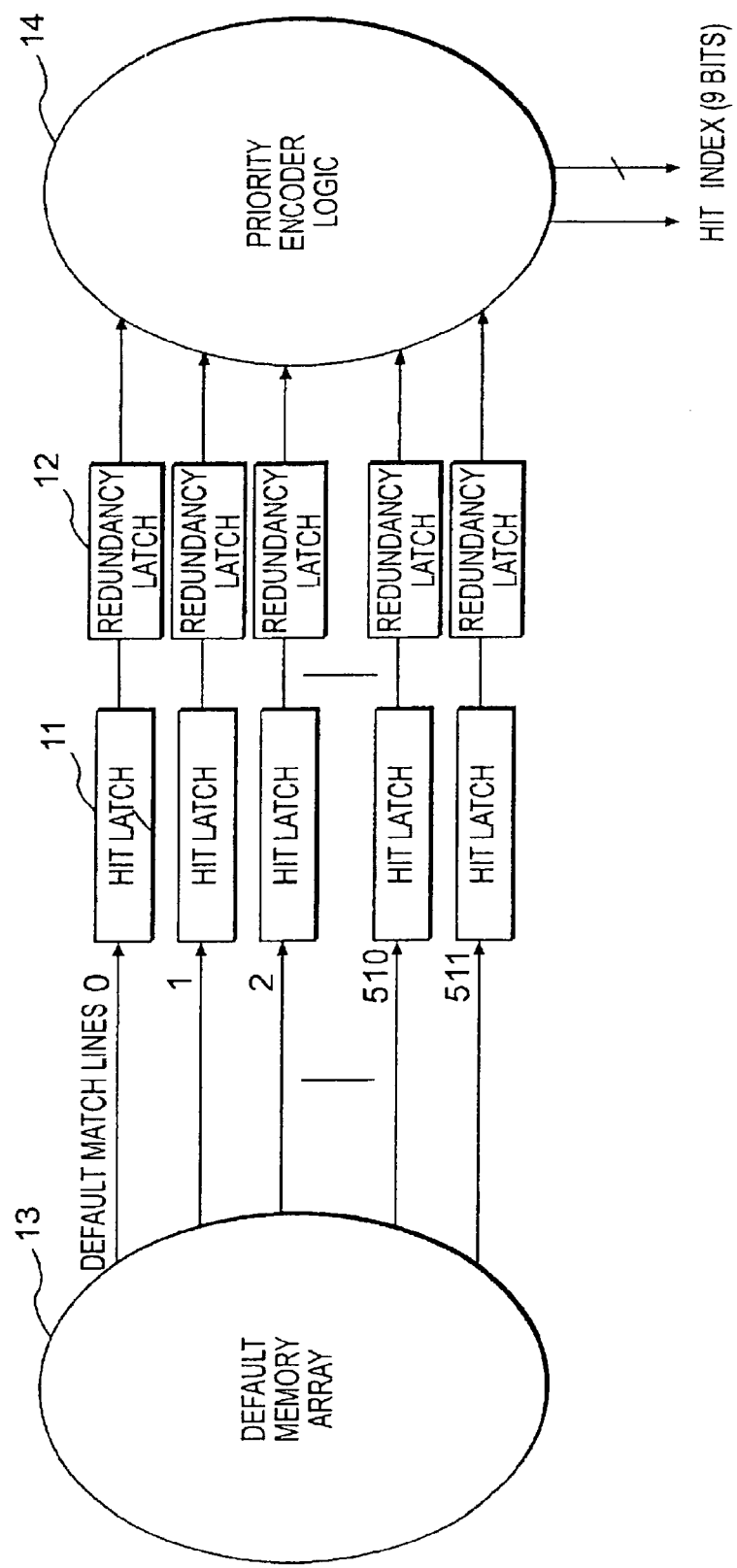
FIG. 1 illustrates an array redundancy architecture in CAM.

An embodiment of the present invention will now be explained below, with reference to the drawings. FIG. 1 illustrates the high level system implementation of the invention. The hit latches 11 in FIG. 1 capture hit/miss data for each of the word lines in the CAM array 13 (512 entries) during a search operation. The hit latches 11 feed the redundancy latches 12. The redundancy latches 12 disable the defective entries. (i.e. block replaced entries from participating in the priority encode 14.) Therefore, defective word lines are essentially ignored by the priority encoder logic 14. All outputs of the redundancy latches are logically 'OR' d together. The output of the OR gate is a 'hit' signal which is used to determine if a match exists in the array (i.e. if one or more words provide a match, the hit signal is active). The priority encoder logic also produces an index which provides the matched word address in the array (shown as 9 bits in order to provide an index for 512 words).

Figure 1A:
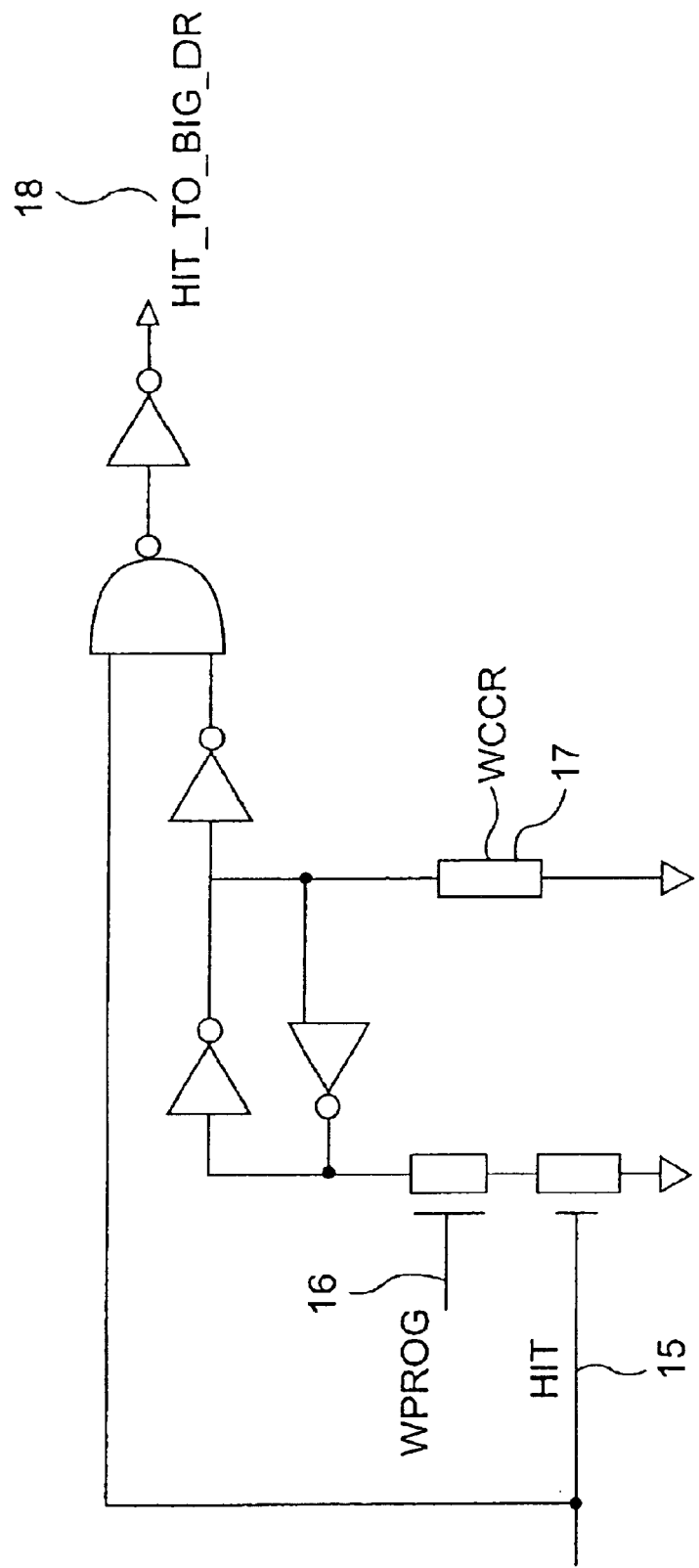
FIG. 1A shows a redundancy latch logic.

The internal logic of the redundancy latch is shown on FIG. 1A. The redundancy latch has 3 inputs, one is the hit signal from the hit latch 15 which is used for programming the redundancy latch as well as a hit detect signal, the second and third input signals, Red _Program 16 and Red_Clear 17, are used to program the redundancy latch. The redundancy latch is first preconditioned to a "no redundancy state" by asserting Red_Clear 17 and resetting the latch so that a "1" appears on the lower input of its NAND gate allowing the propagation of the Hit signals to the Priority Encoder. Stuck matchlines, which will prevent the detection of defective entries, are masked by asserting Red_Program 16 after a CAM search operation with all entries intended to mismatch, (all HIT signals=0) any HIT signals which are not equal to "0" will set the redundancy latch and a "0" appears on the lower input of its NAND gate forcing the redundancy latch output to "0" so that stuck matchlines will never cause HIT=1 on the output of the big OR 18.

The redundancy latches can also be programmed with the hit latch scan function. After resetting the redundancy latch with Red_Clear 17 the hit latch scan chain is loaded so that all defective entries will have HIT=1, then Red_Program 16 is asserted setting the redundancy latch such that the lower input to its NAND is "0" blocking the defective entries HIT signal to the big OR 18.

Figure 2:
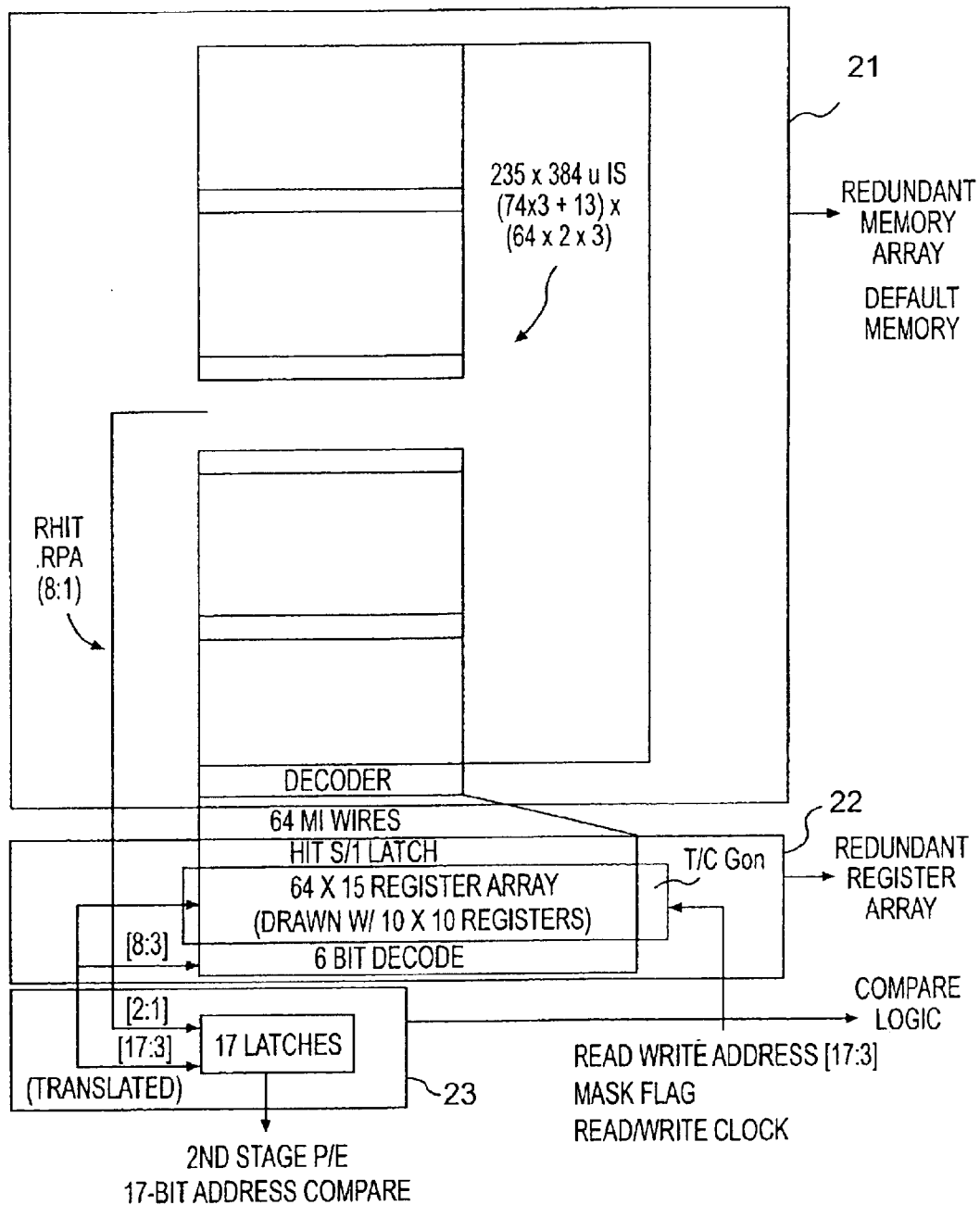
FIG. 2 shows the details of the redundant array, redundant register array, and compare block.

The redundant array 21, redundant register array (RRA) 22 and compare blocks 23 are shown in FIG. 2. The redundant array 21 provides a number of redundant word lines to be used to replace defective word lines in the default array. The embodiment depicted shows 64 redundant word lines, however this number is arbitrary and up to the discretion of the designer. The RRA 22 portion of the architecture serves a dual purpose: during read/write operations, it acts as a CAM in its own right and tells whether the requested address is mapped to the redundant array and, if so, to which redundant entry. During search operations it acts as a lookup table and converts the m-bit redundant hit index to an n-bit result.

The circuitry required to implement the architecture is designed to fit within the whitespace of the design. Since the redundant array 21 will be smaller than the default array, the indexing scheme requires fewer bits (for this example, 6 bits are needed) and therefore translation is required when comparing results to the default array. The RRA 22 provides index translation in both directions: redundant to default and default to redundant. Therefore, the RRA 22 is able to process both search and read/write requests. The compare circuitry is provided in order to account for the case when matches occur in both the default and redundant arrays 21. When this happens, the comparator 23 will select the lowest index of occurrence.

Figure 3:
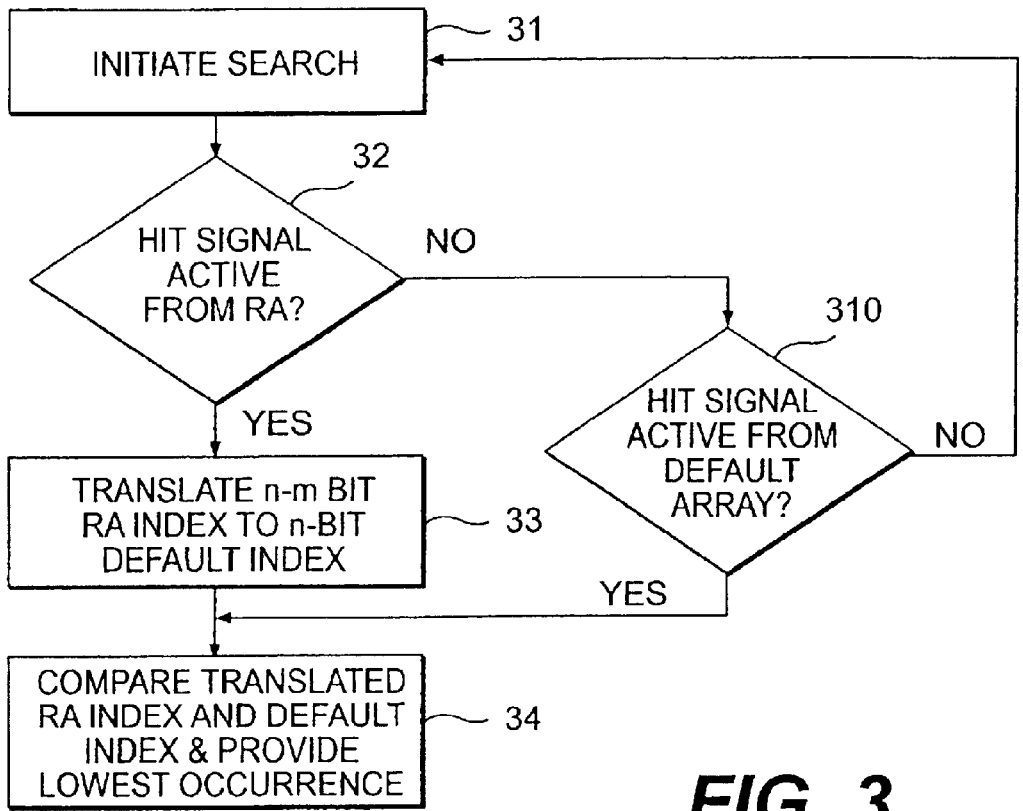
FIG. 3 demonstrates the flow-chart of architecture functioning.
Figure 4:
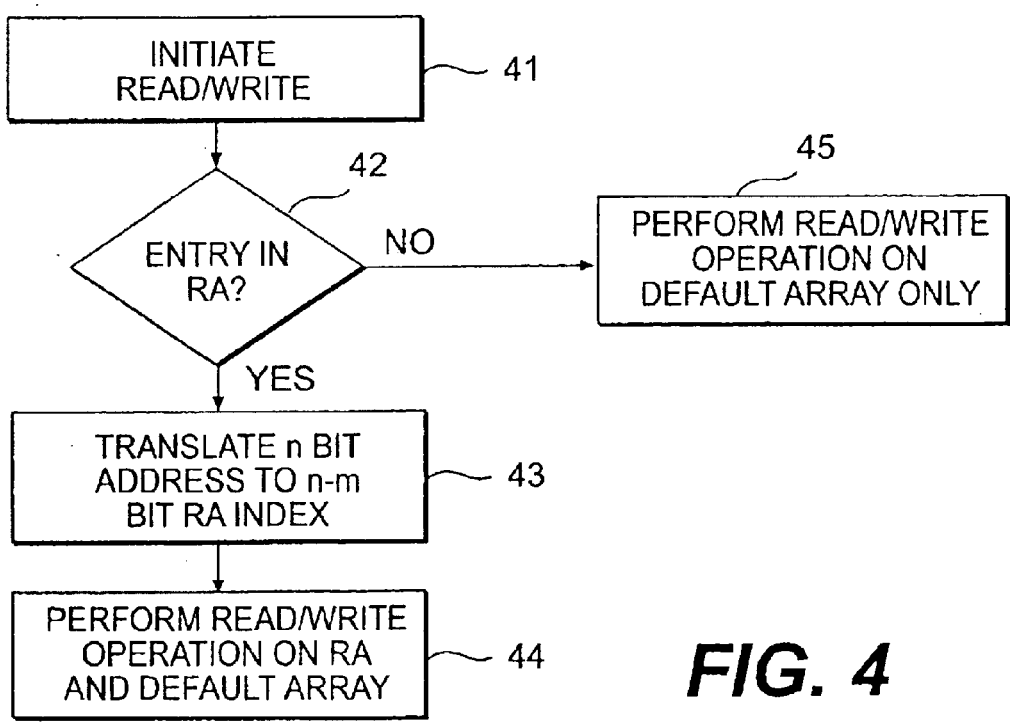
FIG. 4 shows the flow-chart of a read/write operation.

This architecture can support parallel search of both default and redundant arrays. During a search operation 31 (see FIG. 3), if the hit signal from the redundant array is active 32 i.e. a match occurred, the index from the redundant array is translated from m bits to n bits 33. If a hit also occurred in the default array, the comparator provides the lowest index of occurrence 34. During a read/write operation 41 (see FIG. 4), an n-bit address is translated to m bit index by the RRA. The RRA first checks whether the n-bit address is in the redundant array 42 and then converts that address to a m bit index 43 and selects it for read/write operation 44. If the m index is not in the redundant array, the read/write operation is only performed in the default array 45.

We claim:

1. A method of redundancy of word-lines in a content-addressable memory, comprising the step of parallel search of both default and redundant arrays and capturing hit/miss data for each of the word lines in the default CAM array and the redundant CAM arrays.

2. The method of claim 1 further comprising the step of comparison of the redundancy array index and default memory array index in order to provide the lowest index of occurrence.

3. A method of claim 1 further comprising the step of read/write operation when n-bit address is translated to a m bit index by the redundancy register array.

4. The method of claim 1 further comprising the step of checking by redundancy register array whether the n-bit address is in the redundant array.

5. The method of claim 1 further comprising the step of converting n-bit address to a m bit index.

6. The method of claim 1 further comprising the step of selecting m bit address for read/write operation.

* * * * *